United States Patent
Lee et al.

(10) Patent No.: US 7,924,100 B2
(45) Date of Patent: Apr. 12, 2011

(54) CRYSTAL-LESS COMMUNICATIONS DEVICE AND SELF-CALIBRATED CLOCK GENERATION METHOD

(75) Inventors: Chen-Yi Lee, Hsinchu (TW); Jui-Yuan Yu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 178 days.

(21) Appl. No.: 12/180,176

(22) Filed: Jul. 25, 2008

(65) Prior Publication Data

US 2009/0278617 A1    Nov. 12, 2009

(30) Foreign Application Priority Data

May 12, 2008    (TW) ................................ 97117423 A

(51) Int. Cl.
*G01R 23/00* (2006.01)

(52) U.S. Cl. ....... 331/44; 331/177 R; 329/307; 329/325; 329/360; 332/125; 332/126; 332/127

(58) Field of Classification Search .................... 331/44, 331/177 R; 329/307, 325, 360; 332/125–127
See application file for complete search history.

(56) References Cited

U.S. PATENT DOCUMENTS

| | | | | |
|---|---|---|---|---|
| 3,961,261 | A  * | 6/1976 | Pflasterer | 455/154.2 |
| 5,493,710 | A  * | 2/1996 | Takahara et al. | 455/192.2 |
| 5,646,935 | A  * | 7/1997 | Ishikawa et al. | 370/207 |
| 2005/0105595 | A1* | 5/2005 | Martin et al. | 375/140 |
| 2005/0281356 | A1* | 12/2005 | Kim | 375/327 |
| 2006/0158259 | A1* | 7/2006 | Ishizaka et al. | 331/10 |
| 2007/0026831 | A1* | 2/2007 | Jaffe et al. | 455/260 |

* cited by examiner

*Primary Examiner* — Arnold Kinkead
*Assistant Examiner* — Richard Tan
(74) *Attorney, Agent, or Firm* — Muncy, Geissler, Olds, & Lowe, PLLC

(57) ABSTRACT

A communication device uses a local clock generator to regenerate the carrier frequency of the reference signal from a remote communication. In particular, a closed loop is used to self-calibrate the local pulse till the frequency is fixed to be within a fixed frequency margin. Once the local pulse is obtained, the demodulator will use the local pulse to demodulate the reference signal to generate the data signal.

6 Claims, 5 Drawing Sheets

CRYSTAL-LESS COMMUNICATIONS DEVICE AND SELF-CALIBRATED CLOCK GENERATION METHOD

BACKGROUND OF THE INVENTION

1. Field of the Invention

The present invention relates to a communication device, more particularly to a crystal-less communication device and self-calibrated clock generation method.

2. Description of the Prior Art

All kinds of wireless communications in today's electronic products, for example mobile phones, Wireless Metropolitan Area Networks (WMAN), Wireless Local Area Network (WLAN), Satellite Positioning Systems (GPS), and Bluetooth, in addition to emphasize their ease of use and size of appearance, the performance of those cannot be ignored from the focus of research and development. There is no doubt that the base technologies in transmit and receive component are their key functions and play an importance key role successfully.

Existing communications system designs require a crystal to generate reference frequency for the whole system for correct frequency and timing synchronizations in transmitter and receiver. However, the area occupied and the cost from a crystal is extremely large, as shown in FIG. 1. When the communication devices 10 and 20 establish wireless communication, the transmitter and receiver ends need to ensure that the timing and frequency in both communication devices 10 and 20 are synchronized. In order to achieve this objective, there must be a reference clock immune from the external environment changes, like variances in the manufacturing process, operating voltage and temperature. In order to get a reference frequency away from external environment changes, the current wireless transceivers are using an oscillator 30 as a reference frequency. The oscillator 30 with the basic physical characteristics can be a stable frequency source. However, the oscillator 30 share its considerable size, also its hardware price and mounting procedure are very expensive.

Nowadays, existing crystal-less related technologies only achieve limited context about the oscillator. Those technologies can control the frequency error generated by oscillator in a certain range, but this range is only the processor related application can accept.

In the U.S. Pat. No. 6,219,797, A microprocessor has an ability to operate via an external crystal oscillator or be switched to operate in a low power mode via an internal ring oscillator. This patent has the frequency error $|\Delta f| \geq 2.5\%$ which is 625 times bigger than the communications system can tolerate range (40 ppm), so it does not apply to communications devices.

In the U.S. Pat. No. 6,219,797, an integrated crystal-less device generates an output signal with the frequency of the output signal dependent at least in part on a resistive element. The provided circuitry for providing compensation for the temperature coefficient of resistive element, the circuitry includes a bandgap reference and a resistive network. This patent has the frequency error $|\Delta f| \geq 2.5\%$ which is 625 times bigger than the communications system can tolerate range (40 ppm), so it also does not apply to communications devices.

Krishnakumar Sundaresan, et. Al., (IEEE J. Solid-State Circuits, vol. 41, no. 2, pp. 433-442) reports on the design and characterization of a process, temperature and supply compensation technique for a 7-MHz clock oscillator in a 0.25/spl mu/m, two-poly five-metal (2P5M) CMOS process. The paper has the frequency error $|\Delta f| \geq 2.5\%$ which is 625 times bigger than the communications system can tolerate range (40 ppm), so it is impossible to apply to communications devices.

In WBAN applications, we have ultra-low power requirements for WSNs because of the portable and long period body health monitor considerations. Although crystal-less based system can reduce large power consumption, it suffers a significant clock mismatch between the CPN and WSNs that could damage the system performance because of SCO and CFO. This clock mismatch is resulted from the PVT issue when the ring oscillator is used. The existing crystal-less oscillator that the programmers are designed in a manner that in the absence of quartz crystal as a reference frequency support, how to overcome the external environment parameters drift of the oscillator frequency error. And these were related to the design of the microprocessor-related systems and applications.

However, in a wired or wireless communication systems, to send and receive signals successfully, the frequency of error that transceivers can tolerate at both ends is very low, so only to control the error of oscillator still cannot achieve applications' communication. In order to deal with the clock mismatch issue between the CPN and WSNs, we need to estimate the value of the mismatch and then "tune" or "adjust" the ring oscillator toward the correct clock period. Therefore, to find other solutions in communication systems in the realization of a crystal-less technology must have another thinking.

SUMMARY OF THE INVENTION

To solve the above-mentioned problem, the present invention provides a crystal-less communication device for wireless or wired-line communications, which adopts an embedded virtual crystal to make communication device operative without a physical crystal. The embedded virtual crystal can be implemented from any kinds of circuit implementation processes, especially the CMOS process. As a result, the hardware can be designed in the way of highly integration and extremely low cost. Also, this can largely change and improve existing communications design architecture, hardware cost, and hardware area.

To solve the above-mentioned problem, the present invention provides a self-calibrated embedded virtual crystal clock generation method in a communication device, the self-calibrated and synchronization process will be finished before the reference signal stops. After self-calibrated process is finished, the embedded virtual crystal can provide precise clock signals to other connected circuits in the crystal-less communication device.

To achieve the above-mentioned objective, one embodiment of the present invention provides a crystal-less communication device, including a communication device receiving signals transmitted from a remote communication device and processing the signals with output pulses from an embedded virtual crystal to generate signals for the communication device, wherein the signals are similar to oscillator's signals and make communication device operative.

To achieve the above-mentioned objective, another embodiment of the present invention provides a crystal-less communication device, including: a frequency differentiation unit receiving a first signal transmitted from a remote communication device and processing the first signal to generate a differential signal; an embedded virtual crystal oscillator coupled to the frequency differentiation unit and receiving the differential signal for calibration, and generating an output pulse; and a synthesizer coupled to the frequency differentiation unit and the embedded virtual crystal oscillator for receiving and processing the output pulse, and generating a second signal to the frequency differentiation unit.

To achieve the above-mentioned objective, another embodiment of the present invention provides a self-calibrated embedded virtual crystal clock generation method in a communication device, including: receiving a reference signal; comparing the reference signal and an output pulse from an embedded virtual crystal oscillator in the communication device; detecting the differential value between the reference signal and the output pulse; calculating the differential value to generate a numeric error; and renewing the output pulse in the embedded virtual crystal oscillator by using the numeric error.

Other advantages of the present invention will become apparent from the following description taken in conjunction with the accompanying drawings, which are set forth by way of illustration and example, to certainly embody the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed explanation of the present invention is described as following. The described preferred embodiments are presented for purposes of illustrations and description, and they are not intended to limit the scope of the present invention.

In communications systems, we have low area or cost requirements. To meet these requirements, the present invention proposes a crystal-less scheme in the device for wireless or wired-line communications.

A crystal-less communication device receives signals transmitted from a remote communication device and processes the signals with output pulses from an embedded virtual crystal to generate stable frequency signals for the crystal-less communication device, wherein the stable frequency signals are similar to oscillator's signals and make communication device operative. The crystal-less communication device and the remote communication device communicate in a wire-line or wireless communication system.

Figure 1:
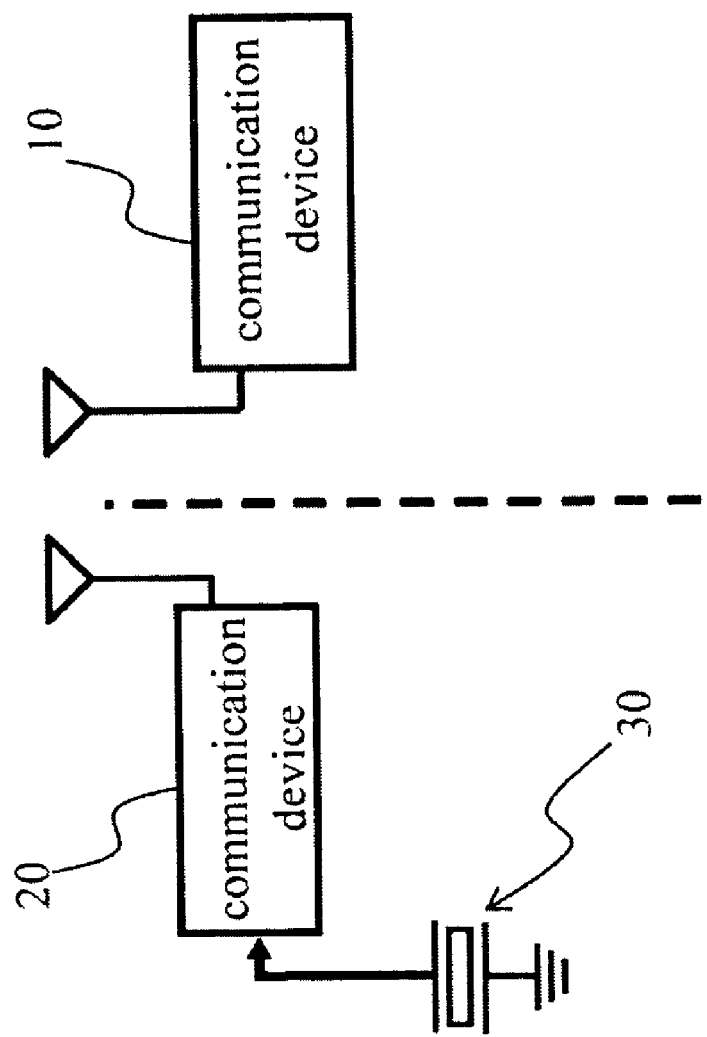
FIG. 1 is a diagram illustrating a conventional communication device with a crystal oscillator in a communication system.
Figure 2:
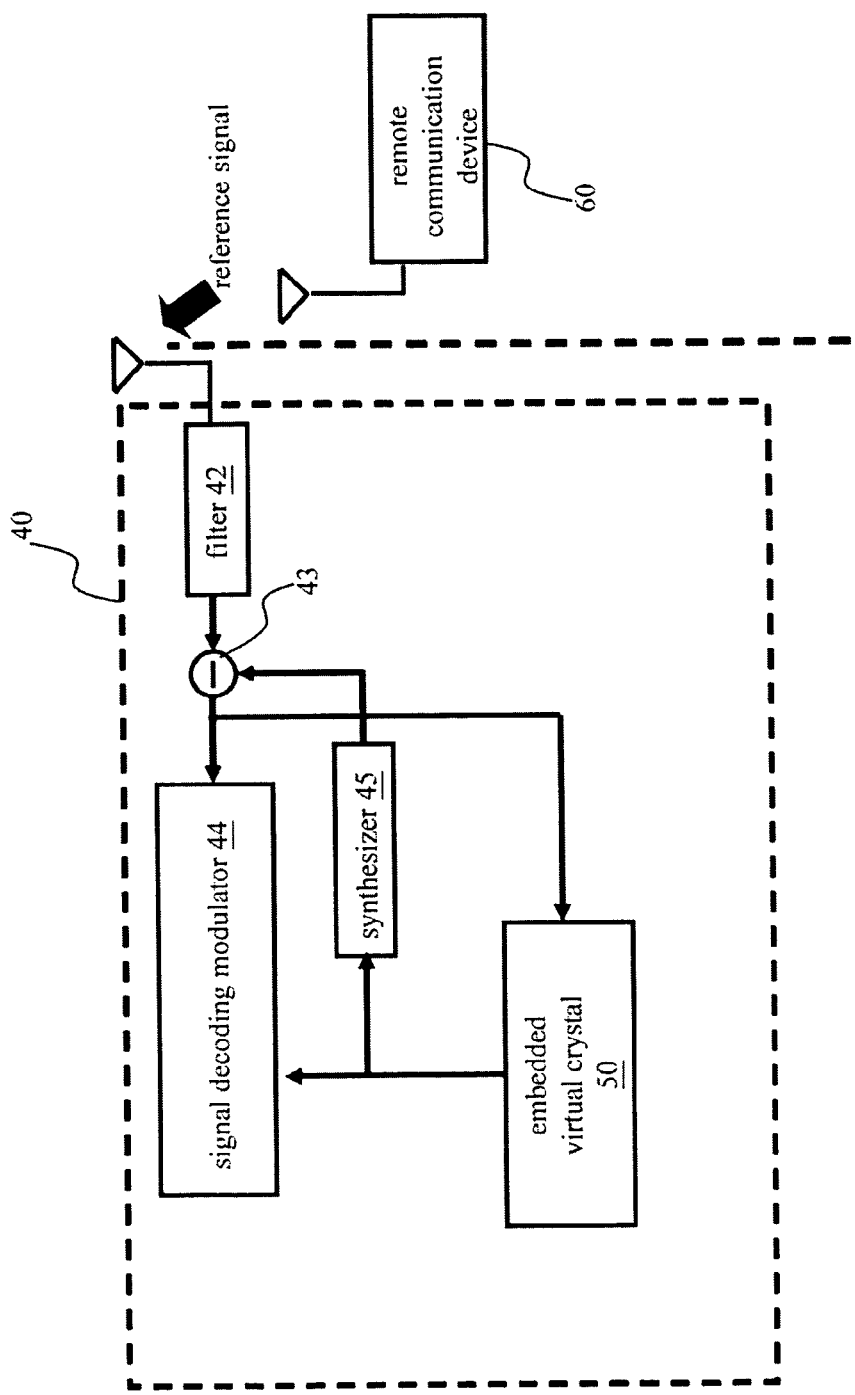
FIG. 2 is a schematic diagram illustrating a crystal-less communication device according to one embodiment of the present invention.

The present invention discloses the concept of a 'Virtual Crystal' to prevent from the use of a real physical crystal. This is achieved via the circuit-design methodology to realize this required reference frequency. FIG. 2 is a schematic diagram illustrating a crystal-less communication device according to one embodiment of the present invention. A remote communication device 60 transmits a reference signal to the crystal-less communication device 40, in which a frequency differentiation unit 43 receives the reference signal and processes it to generate a differential signal to an embedded virtual crystal 50. A local clock generator (not shown) in the embedded virtual crystal 50 couples to a synthesizer 45, which coupled to the frequency differentiation unit 43, to provide output pulses for it. The frequency differentiation unit 43 receives the reference signal and the output signal from the synthesizer 45 to generate a differential signal because of mismatch between two frequencies. If the differential signal has its error within the range that the base band system can tolerate, then the differential signal is sent to the signal decoding modulator 44; otherwise the embedded virtual crystal 50 will receive and process it for frequency mismatch recovery.

A filter 42 is coupled to the input end of the frequency differentiation unit 43 to remove noise signal components in the reference signal.

When the reference signal from the remote communication device 40 has error, the differential signal from the frequency differentiation unit 43 will have frequency error or phase error specifying their characteristics. So the present invention uses the embedded virtual crystal 50 as an oscillator, which receives the differential signal and the output pulse from the local clock generator to output an oscillating frequency for clock mismatch recovery. The synthesizer 45 adjusts the output pulse in a receivable range to the frequency differentiation unit 43. At last step, the signal decoding modulator 44 coupled to the frequency differentiation unit 43 receives the differential signal, wherein the differential signal is within a fixed margin of error; otherwise the signal decoding modulator 44 will not be activated to decode the output signal from the frequency differentiation unit 43.

Figure 3:
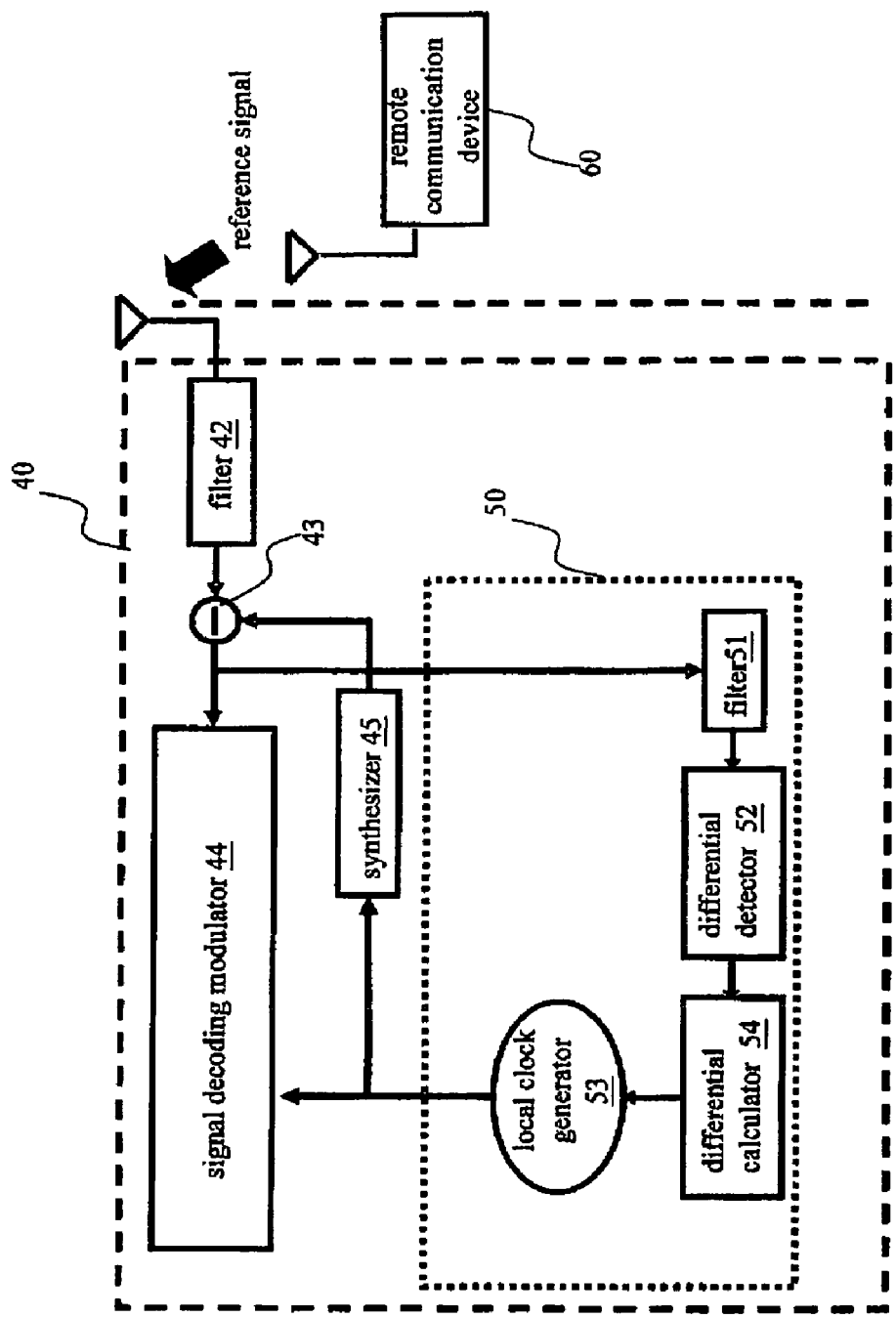
FIG. 3 is a schematic diagram illustrating a detail description for the crystal-less communication device in FIG. 2.

FIG. 3 is a schematic diagram illustrating a detail description for the crystal-less communication device in FIG. 2. The filter 51 is coupled to output end of the frequency differentiation unit 43 to remove noise signal components in output signals. A differential detector 52 coupled to the frequency differentiation unit 43 for receiving the differential signals can detect differences between the frequency of the remote communication device 60 and crystal-less communication device 40 and generate a differential feature. A differential calculator 54 is coupled to the differential detector 52 to receive the differential feature to generate a frequency error. Then the frequency error is sent to a local clock generator 53 for adjustment to provide an output pulse to the synthesizer 45, which receives and processes the output pulse and generate a signal to the frequency differentiation unit 43. If the output pulse has its error range under the circumstance that the frequency differentiation unit 43 can make down-conversion of the signal from the remote communication device, the signal decoding modulator 44 will begin decoding the signal to generate data signal. The embedded virtual crystal 50 disclosed by the present invention can be implemented in a circuit design to simulate all functions of a crystal oscillator doing in the circuit. In some embodiments the embedded virtual crystal 50 embodied in communications chips will has smaller size and lower cost for the crystal-less communication device.

Referring to FIG. 3, the present invention can be used in wireless communication system. The remote communication device 60 transmits a reference signal with precise 1.4 GHz frequency to the crystal-less communication device 40 as a reference signal to "tune" or "adjust" the internal clock frequency. As the crystal-less communication device 40 turns on, the local clock generator 53 generates a 35 MHz $f_{baseband}$ clock pulse, which has a clock mismatch ($\epsilon$) controlled within absolute value of 2.5%. The synthesizer 45 generates 40 times of 1.4 GHz frequency $f_{out}$, which has same clock mismatch ($|\epsilon| \leq 2.5\%$) as local clock generator 53 does.

The low pass filter 42 and the frequency differentiation unit 43 make the reference signal down conversion to $R_{before\_LPF}$ as the equation (1).

$$R_{beforeLPF}(t) = \text{synthesize r\_out} * \text{reference\_signal} \quad (1)$$
$$= \cos[2\pi \cdot 1.4G(1 + \varepsilon)]t \cdot \cos(2\pi \cdot 1.4G)t$$
$$= \frac{1}{2}\cos(2\pi \cdot 1.4G \cdot \varepsilon)t +$$
$$\frac{1}{2}\cos[2\pi \cdot 1.4G \cdot (2 + \varepsilon)]t$$

As $\epsilon$=2.5%, a low pass filter 51 with baseband 35 MHz frequency filters off high frequency in equation (1), the output of the low pass filter 51 is expressed as equation (2)

$$R_{afterLPF}(t) = \frac{1}{2}\cos(2\pi \cdot 1.4G \cdot \varepsilon)t \quad (2)$$

It shows the maximum of $R_{after\_LPF}$ is 35 MHz if $\epsilon$=2.5%, meaning the frequency of $R_{after\_LPF}$ can be calculated to obtain clock mismatch ($\epsilon$). The differential detector 52 is designed to detect the frequency between 56 kHz and 35 MHz. The frequency that the differential detector 52 detects will provide the local clock generator 53 to adjust the output frequency. The frequency for the differential detector 52 is lower than 56 kHz; clock mismatch ($\epsilon$) is below the value 40 ppm specified by the system.

Accordingly the overall performance of embedded virtual crystal 50 acts as a virtual crystal to recovery reference clock within the margin of error required by the system.

Figure 4:
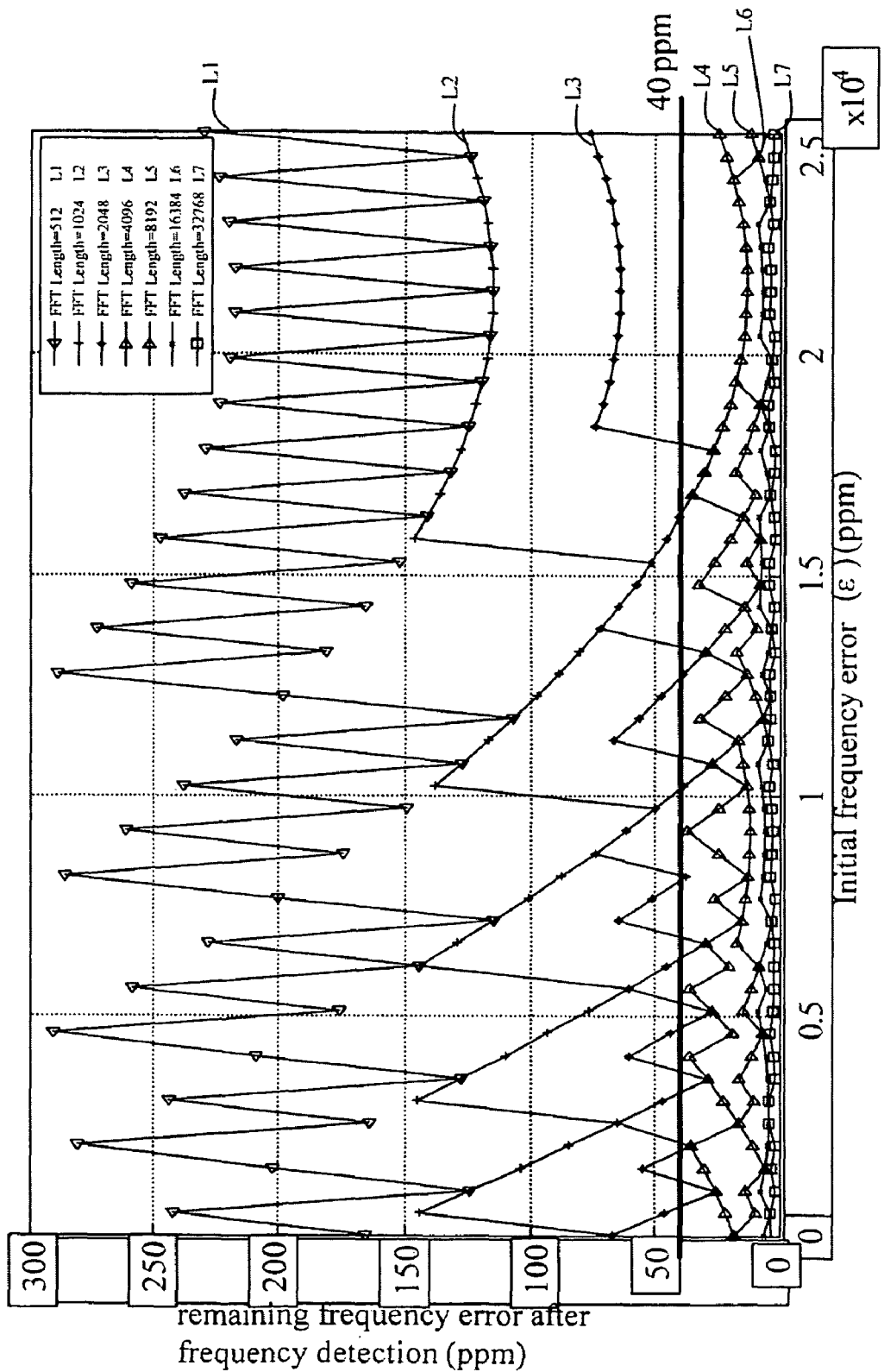
FIG. 4 is a graph illustrating initial mismatch and remaining frequency error after frequency detection with various FFT lengths according to one embodiment of the present invention.

In one embodiment, the differential detector 52 can be realized by using an ADC circuit and a FFT circuit. As the differential detector 52 receives $R_{after\_LPF}$, the ADC circuit samples $R_{after\_LPF}$ to get digital signal that is transformed to the FFT circuit. The output of FFT circuit is a signal spread in frequency domain, which presents the frequency components in $R_{after\_LPF}$, thus the frequency detection is done. Referring the FIG. 4 is a graph illustrating initial mismatch and remaining frequency error after frequency detection with various FFT lengths. The differential detector 52 with FFT Length=4096 above (L5, L6, L7, L8) is capable of detecting the frequency of $R_{ater\_LPF}$ and control the frequency error below 40 ppm. Meaning the frequency error of 2.5% is lower than 40 ppm.

According to the mention above, the present invention discloses operation concepts that the remote communication device (transmitter) provides crystal-less communication device (receiver) a reference signal, and crystal-less communication device processes this signal to generate a corresponding reference frequency, which matches the one from the remote communication Device. The reference signal is a crystal-like signal to provide the crystal-less communication device a operational frequency.

Figure 5:
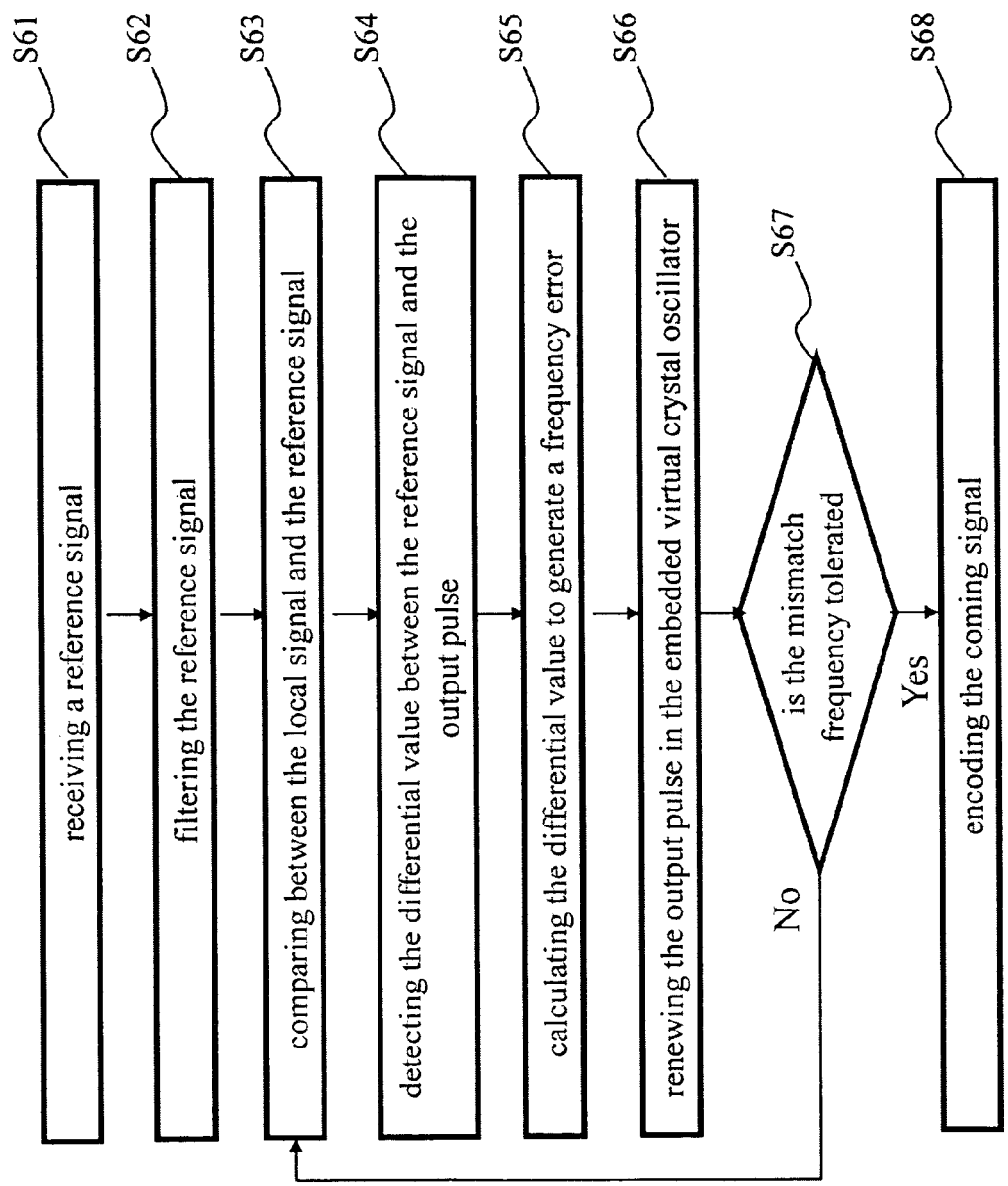
FIG. 5 is a flowchart of a self-calibrated embedded virtual crystal clock generation method in a crystal-less communication device according to one embodiment of the present invention.

Referring FIG. 5 is a flowchart of a self-calibrated embedded virtual crystal clock generation method in a crystal-less communication device according to one embodiment of the present invention. The method operating in communication system includes following steps: the step S31 receiving a reference signal, a crystal-lass communication device receives a reference signal from a remote communication device; the step S32 filtering the reference signal, a filter removes unwanted signal to extract the reference signal; step S63 comparing between the local signal and the reference signal, an output pulse from an embedded virtual crystal in the communication device are compared with the reference signal; step S64 detecting the differential value between the reference signal and the output pulse; step S65 calculating the differential value to generate a numeric error; step S66 renewing the output pulse in the embedded virtual crystal oscillator by using the numeric error; step S67 is the mismatch frequency tolerated? After renewing the output pulse in the embedded virtual crystal oscillator, if the output pulse's error is within a fix range then begin step S68 to encode the coming signal, otherwise goes to step S63, S64, S65, S66 to continue generating the next numeric error until the output pulse matches the frequency of the communication system. The output pulse after renewing step is a precise clock signal.

The numeric error is a frequency error or phase error.

In the self-calibrated embedded virtual crystal clock generation method, the self-calibrated and synchronization process will be finished before the reference signal stops. After self-calibrated process is finished, the embedded virtual crystal can provide precise clock signals to other connected circuits in the crystal-less communication device.

Therefore, in the condition of non-use of physical oscillator, the present invention discloses the concept of embedded virtual crystal, the use of the circuit design similar to the way of oscillator's frequency to be a reference clock (shown in FIG. 2 and FIG. 3). The operation concepts are that the transmitter provides the receiver a reference signal, and receiver takes this reference signal to generate a corresponding reference frequency, which matches the one from the transmitter. As a result, the concept of a 'Virtual Crystal' prevents from the use of a real physical crystal. This is achieved via the circuit-design methodology to realize this required reference frequency, as shown in FIG. 2. By current CMOS process, the present invention may be integrated in one communication chip with other circuits to accomplish small size and low cost purpose. This changes current circuit design, which uses an isolate crystal, to bright an architecture improvement.

Those skilled in the art can realize that the teachings of the present invention as described hereinabove provides circuitry that comprehends above. In order to maintain a successful communication link between the transceivers, the frequency error is controlled in the ±20 ppm. Thus the present invention in the non-use of crystal using system correction method coupled with hardware approach, has the ability to control the communications device to achieve the required frequency accuracy. Regardless of how much frequency mismatch the transceivers initially have at both ends, the invention of the method will convergence the frequency error to the accuracy, to achieve further success of the communication.

Furthermore, this invention is done via the circuit-design methodology, so it can be implemented from any kinds of circuit implementation processes, especially the CMOS process. As a result, the hardware can be designed in the way of highly integration and extremely low cost. Also, this can largely change and improve existing communications design architecture, hardware cost, and hardware area.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A communication device, comprising:
    a frequency differentiation unit receiving a reference signal with a first frequency and a local pulse with a second frequency to generate a differential signal according to a difference between said first frequency and said second frequency;
    a decoding modulator connected with said frequency differentiation unit for receiving said differential signal;
    an embedded virtual crystal connected with said frequency differentiation unit for receiving said differential signal and generating a local signal; and
    a synthesizer coupled to said frequency differentiation unit and said embedded virtual crystal for receiving said local signal to generate said local pulse and to provide said frequency differentiation unit with said local pulse, wherein
    said frequency differentiation unit, said embedded virtual crystal and said synthesizer form a closed loop to adjust said second frequency of said local pulse according to said differential signal, and
    said local signal is sent to said decoding modulator for decoding said differential signal to generate a data signal when said differential signal is within a fixed error margin, or
    said second frequency of said local pulse is reset and resent to said frequency differentiation unit for renewing said differential signal when said frequency differential signal is out of said fixed error margin.

2. The communication device as claimed in claim 1, further comprising a first filter coupled to the input end of the frequency differentiation unit to remove noise signal components in said reference signal.

3. The communication device as claimed in claim 1, wherein said embedded virtual crystal further comprises:
    a local clock generator for receiving a frequency error and generating said local signal according to said frequency error;
    a differential detector coupled to said frequency differentiation unit for receiving said differential signal to generate a differential feature; and
    a differential calculator coupled to said differential detector and said local clock generator for receiving said differential feature and generating said frequency error.

4. The communication device as claimed in claim 3, further comprising a second filter coupled to input end of said embedded virtual crystal for removing noise signal components in said differential signal.

5. A self-calibrated clock generation method in a communication device, comprising:
    receiving a reference signal with a first frequency from a remote communication device and a local pulse with a second frequency from a synthesizer;
    generating a differential signal according to based on a frequency mismatch between said reference signal and said local pulse;
    detecting said differential signal to generate a differential feature;
    generating a frequency error according to said differential feature;
    calculating the frequency error to generate a numeric error;
    determining whether said numeric error is within a fixed error margin or not; and
    resetting said second frequency of said local pulse and then repeating the above steps from the step of generating said differential signal if said numeric error is out of said fixed error margin; or
    decoding said differential signal by using a local signal based on said numeric error to generate a data signal if said numeric error is within said fixed error margin.

6. The self-calibrated clock generation method in a communication device as claimed in claim 5, further comprising removing noise signal components from said reference signal before the step of receiving said reference signal.

* * * * *